United States Patent [19]
Gast et al.

[11] Patent Number: 5,442,575
[45] Date of Patent: Aug. 15, 1995

[54] SCANNING ANALOG-TO-DIGITAL CONVERTER OPERATING UNDER THE SUBRANGING PRINCIPLE

[75] Inventors: Werner Gast, Köln; Andrey Georgiev, Niederzier; Rainer M. Lieder, Jülich, all of Germany

[73] Assignee: Forschungszentrum Julich GmbH, Julich, Germany

[21] Appl. No.: 240,985

[22] Filed: May 11, 1994

[30] Foreign Application Priority Data

May 19, 1993 [DE] Germany .................. 43 16 910.4

[51] Int. Cl.6 ............................................. G06J 1/00
[52] U.S. Cl. ................................................ 364/602
[58] Field of Search .............. 364/602, 605, 724.01, 364/724.17; 341/155, 156

[56] References Cited

U.S. PATENT DOCUMENTS

| | | | |
|---|---|---|---|
| 4,093,989 | 6/1978 | Flink et al. | 364/602 |
| 4,373,189 | 2/1983 | Weant | 364/602 |
| 5,150,324 | 9/1992 | Takasuka et al. | 364/602 |
| 5,307,299 | 4/1994 | Stein et al. | 364/728.01 |

Primary Examiner—Tan V. Mai
Attorney, Agent, or Firm—Herbert Dubno

[57] ABSTRACT

A sampling analog-to-digital converter operating in accordance with the subranging principle and with interpolation residue coding has a coarse value of the input signal applied to an integrator through a differential analog-to-digital converter (ADC) and a summer. The residue is also supplied to this integrator by conversion of the output of the integrator to an analog signal by a DAC and subtracting that signal from the input signal, advantageously supplied to the subtractor through a time-delay unit. The output of the subtractor is fed through an analog-to-digital converter which provides the second input to the above-mentioned summer. By comparison with the internal ADCs, the sampling circuit has a greater dynamic range and higher resolution and precision. It is particularly suited for input signals with rapid rise and slow decay as obtained from semiconductor detectors of a nuclear spectrometer.

19 Claims, 2 Drawing Sheets

SCANNING ANALOG-TO-DIGITAL CONVERTER OPERATING UNDER THE SUBRANGING PRINCIPLE

SPECIFICATION

1. Field of the Invention

The present invention relates to a sampling analog-to-digital converter with coarse/fine range architecture and interpolating residue coding, especially for the sampling of statistically appearing signals and particularly those having a fast leading edge and slow trailing edge as result in nuclear spectroscopy with semiconductor detectors. The invention, more particularly, relates to sampling analog-to-digital conversion in a two-step process in accordance with the subranging principle and such circuits have been referred to as subranging analog-to-digital converters (SADCs) and utilize interpolating residue coding.

2. Background of the Invention

In the commonly owned U.S. Pat. No. 5,307,299, issued April 1994 on application Ser. No. 07/988,095 of 9 Dec. 1992, filed on behalf of two of the currently-named inventors and others, there is described a circuit arrangement for the digital processing of semiconductor detector signals of the type which arise in nuclear spectroscopy.

In general, sampling of semiconductor detector signals in such spectroscopic systems, utilized for the measurement of the energy of individual radiation quantity, utilize a sampling wherein the signals are converted into digital form to enable digital processing of the sampled signal.

Semiconductor spectrometer systems have a wide range of applications and can be utilized in from applications such as measuring systems for environmental protection, medicine, materials research to experimental projects in nuclear physics and cosmology.

The sampling of semiconductor detector signals has been accomplished in the past with the aid of parallel converters, i.e. so-called flash analog-to-digital converters (flash-ADC). The latter have generally been found to be fast enough to satisfy at least current needs but have a limited resolution, reduced precision and high differential nonlinearity.

The sampling can also be carried out with converters operating in accordance with binary weighting processes and successive approximations. These have high precision but in terms of the attainable scanning rates, must be considered too slow since many binary weighting steps are required to effect the conversion.

In order to improve the conversion time, converters operating under the subranging principle with two-step processes and coarse/fine range architectures have been used. In these systems, the conversion has been divided into a coarse range and a fine range. The input signal is initially digitalized from a fast parallel converter (flash converter) which supplies a coarse value of the input signal. This coarse value is stored as a higher value portion (MSB:most significant bits) of the digital final result and simultaneously with the aid of a digital-to-analog converter is transformed back into an analog signal.

In a second stage the analog remainder signal (residual) is formed as the difference between the original input signal and its analog course value. This remainder signal is amplified and further digitalized with a second parallel converter. In this manner one can obtain a fine value, i.e. the lower value portion (least significant bits) of the end result. The combination of the two components yields the complete digital final result.

This process is faster than binary weighting processes. However in these systems the resolution is also limited and because of the formation and conversion of the remainder signal, errors may be produced which limit the accuracy as a rule to a point that the technique has not been satisfactory to precisely scan semiconductor detector signals. The problem of unsatisfactory differential nonlinearity also can arise upon exact balancing of the two ranges.

OBJECTS OF THE INVENTION

It is the principal object of the present invention to provide an improved circuit for the scanning of signals, especially fast-rise and slow-decay signals as are outputted by semiconductor detectors in nuclear spectroscopy whereby drawbacks of earlier circuits are avoided.

Another object of the invention is to provide a circuit for the scanning of statistically arising semiconductor detector signals which affords a high scanning rate, i.e. short conversion times, and by comparison to circuits utilizing parallel converters, has higher resolution and precision, as well as a greater dynamic range and a reduced differential nonlinearity.

It is also an object of this invention to provide a scanning analog-to-digital converter operating in accordance with the subranging principle and with interpolating remainder coding so that high scanning rates and high precision are obtained.

SUMMARY OF THE INVENTION

These objects and others which will become apparent hereinafter are attained, in accordance with the present invention, in a circuit arrangement for scanning statistically-arising signals and especially those with a rapid rise time and slow decay, which can be produced by semiconductor detectors in nuclear spectroscopy, the scanning analog-to-digital converter operating in accordance with the two-step process with coarse-range and fine-range architecture, i.e. in accordance with the subranging principle, and interpolated remainder coding. According to the invention, the SADC comprises:

an internal differentiating analog-to-digital converter receiving the input signals and producing a sampled sequence of the differentiated input signals at a sampling frequency;

a summer having one input connected to an output of the differentiating analog-to-digital converter;

an integrator connected to an output of the summer for digitally integrating a signal outputted from the summer and producing at an output of the integrator a digital reconstruction of scanned input signals;

a digital-to-analog converter connected to the integrator and receiving a signal representing the digital reconstruction of sampled input signals and transforming the received signals into an analog signal corresponding to the digital reconstruction of sampled input signals;

an analog subtractor connected to the digital-to-analog converter and receiving the input signals for subtracting the analog signals from the input signals to form an analog residue signals; and an internal analog-to-digital converter for the analog residue connected to the analog subtractor and operating at the sampling frequency for digitalizing the analog residue and producing a digital residue signal, the digital residue signal being supplied to another input of the summer for addition to the digital signal produced by the differentiating analog-to-digital converter in the summer, thereby providing higher resolution and enhanced dynamic range by comparison with those of the internal analog-to-digital converters.

The circuit according to the invention has a short converter time and by comparison to parallel converters when used in such detection circuits, higher resolution and precision as well as a greater dynamic range and a reduced differential nonlinearity.

In the system of the invention, the coarse value is obtained by a digital integration of the input signal scanned by a differentiating analog-to-digital converter. In this manner, one can obtain a digitally reconstructed coarse value of the original nondifferentiated input signal. The coarse value is then converted back into an analog signal by a digital-to-analog converter and with the aid of an analog subtractor is subtracted from the original input signal.

Thus a remainder signal or residuum is obtained. The remainder signal in a feed-back loop is digitalized with the aid of an analog-to-digital converter and the result is added to the coarse value supplied to the integrator.

According to a feature of the invention, the differentiating analog-to-digital converter comprises an analog differentiator having an input receiving the input signals and an output, and an analog-to-digital converter connected to the output of the differentiator and having an output connected to the summer and forming the output of the differentiating analog-to-digital converter. The analog differentiator of the differentiating analog-to-digital converter can be a flash analog-to-digital converter, see the aforementioned application Ser. No. 07/988,095 (U.S. Pat. No. 5,307,299).

The apparatus of the invention, therefore, thus utilizes conventional electronic components such as an analog differentiator and an analog-to-digital converter (ADC). The input of the analog differentiator thus simultaneously forms the input to the differentiating analog-to-digital converter. The output of the ADC is simultaneously the output of the differentiating analog-to-digital converter. The output of the analog differentiator is connected to the input of the ADC.

According to another feature of the invention, the ADC for digitalizing the analog remainder signal, which is the difference between the input signal and the digitally reconstructed signal converted back to an analog signal, can be a flash ADC with at least one bit resolution.

The analog subtractor can be a differential amplifier and, if desired, the digital integrator can be replaced by a digital accumulator. According to this latter aspect of the invention, the digital accumulator can include a summer and a register in cascade with a first input of the summer being constituted as an input of the accumulator, a second input of this latter summer is connected with an output of the register and the latter output is also an output of the accumulator.

According to another feature of the invention, the internal digital-to-analog converter has a higher resolution than the differentiating analog-to-digital converter.

For compensation of the delay in the internal analog-to-digital converter, the summer, the integrator and the digital-to-analog converter forming the feed-back loop, a delay unit can be provided between the input of the differentiating analog-to-digital converter and the positive input of the subtractor.

According to another feature of this invention, a low-pass filter can be provided between the input of the circuit and the differentiating analog-to-digital converter to avoid the aliasing effect of high-frequency components of the signal and noise.

In yet another feature of the invention, in place of the digital integration of the differentiated and scanned input signal, a digital low-pass filtration is effected. Instead of the digital integrator, a digital low-pass can be provided.

Instead of the differentiation of the input signal, a high-pass filtering can be effected so that in place of the analog differentiator, a high-pass filter can be used.

According to another aspect of the invention, the circuit can comprise:

a high-pass filter delivering high-pass filtered input signals;

an analog-to-digital converter connected to the high-pass filter and producing a sampled sequence of the high-pass-filtered input signals of a sampling frequency;

a summer having one input connected to an output of the analog-to-digital converter;

a digital low-pass filter connected to an output of the summer for digitally processing a signal outputted from the summer and producing at an output of the digital low-pass filter a digital reconstruction of scanned input signals;

a digital-to-analog converter connected to the digital low-pass filter and receiving a signal representing the digital reconstruction of scanned input signals for transforming the received signal into an analog signal corresponding to the digital reconstruction of scanned input signals;

an analog subtractor connected to the digital-to-analog converter and receiving the input signals for subtracting analog signal from the input signals to form an analog residue signal;

a delay unit receiving the input signals and having an output connected to the positive input of the substractor; and an internal analog-to-digital converter for the analog residue connected to the analog subtractor and operating at the scanning frequency for digitalizing the analog residue and producing a digital residue signal, the digital residue signal being supplied to another input of the summer for addition to the digital signal produced by the differentiating analog-to-digital converter in the summer, thereby providing higher resolution and enhanced dynamic range by comparison with those of the internal analog-to-digital converters.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
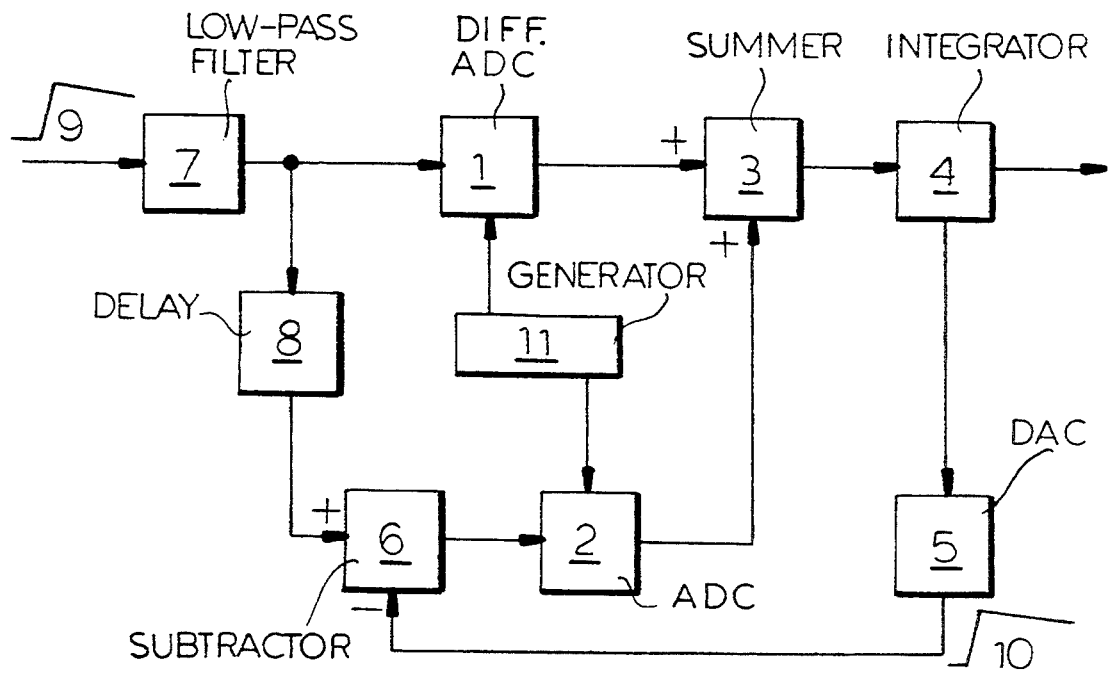
FIG. 1 is a block diagram of the basic circuit of the invention for a sampling analog-to-digital converter utilizing the subranging principle and interpolating remainder coding.

The circuits here shown can be utilized in a semiconductor spectrometer system of the type described in the above-mentioned patent and serves for the sampling of the output signals from the semiconductor detectors thereof. These output signals, which correspond to the input signals 9 of the present application, can be seen to have a rapid rise time and a slow decay. The input signals 9 are initially digitalized by a differentiating analog-to-digital converter 1 (FIG. 1) and the resulting digital value is fed via the summer or adder 3 as one part of a signal to an integrator 4. To avoid the aliasing effects resulting from high-frequency signal components or noise components a low-pass filter 7 can be provided between the input signal source and the differentiating ADC 1 to remove these high-frequency signals and noise.

The output signal from the integrator is supplied to a feed-back loop which includes a digital-to-analog converter 5 transforming this signal into an analog signal 10. The analog signal 10 is subtracted from the input signal 9 in an analog subtractor 6.

The delay in the feed-back loop which is formed by the parallel converter 2, the summer 3, the integrator 4, the digital-to-analog converter 5 and the analog subtractor 6, is compensated by a delay unit 8.

The delay unit 8 is provided between the input of the differentiating analog-to-digital converter 1 and the positive input of the analog subtractor 6.

The output signal of the analog subtractor 6 is a remainder signal which, with the aid of the second analog-to-digital converter 2 is digitalized.

The digital result is fed via the summer 3 to the integrator 4. In this manner, the coarse value and remainder value are added in the summer 3 and accumulated in the integrator 4. The output of the integrator serves as the output of the circuit here described. The resulting output value has, by comparison to the internal converters 1 and 2 of the circuit, a higher resolution and precision, a lower differential nonlinearity and a greater dynamic range.

All remaining errors result in a difference between the input signal and the output value reconverted to an analog signal. These errors are digitalized in the parallel converter 2 and added via the summer 3 to the value arriving at the integrator 4. Nontransient errors of the internal components are thus here compensated.

The generator 11 produces the scanning frequency R with which the analog-to-digital converters are supplied.

Figure 2:
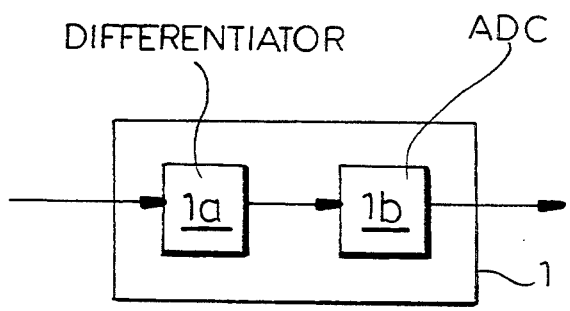
FIG. 2 is a block diagram of a modification for the circuit of FIG. 1.

From FIG. 2 it will be apparent that the differential analog-to-digital converter 1 can be made up of a differentiator 1a and an analog-to-digital converter 1b placed in cascade.

Figure 3:
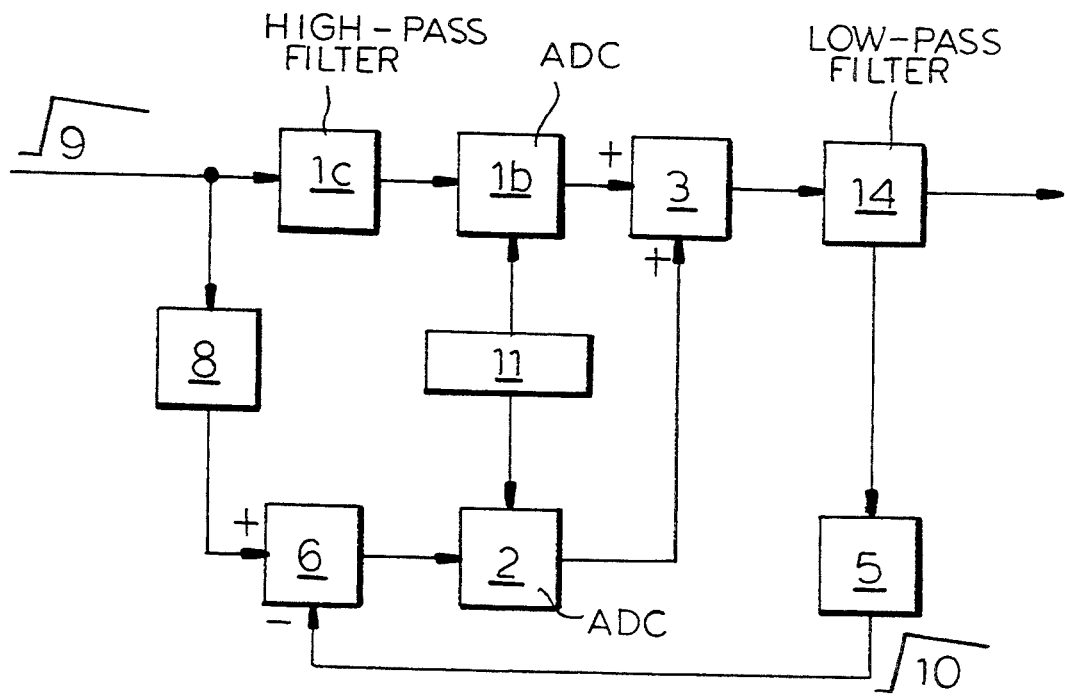
FIG. 3 is a view similar to FIG. 1 of an alternative circuit.

From FIG. 3, it will be apparent that the integrator 4 can be replaced by a low-pass filter 14, a high-pass filter 1c followed by an analog-to-digital converter 1b being provided upstream thereof. In principle, of course, the circuit of FIG. 3 operates in a manner similar to that of FIG. 1.

Figure 4:
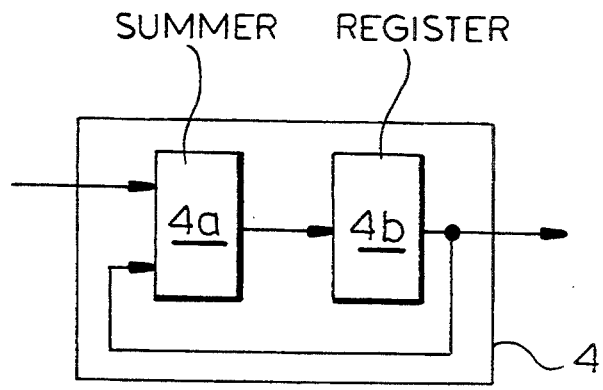
FIG. 4 is a block diagram of an alternative to the integrator of the circuit of FIG. 1.

Finally, also as a substitute for the integrator of FIG. 1, a circuit 4' as has been shown in FIG. 4 can be provided. This circuit 4' can comprise a summer or adder 4a in cascade with a register 4b. One input of the summer 4a receives the input from the summer 3 while its output is connected as the input to the register. The output of the register serves as the output for the entire circuit and also has a second input to the summer 4a.

We claim:

1. A circuit for sampling of statistically appearing signals, especially such signals as result from semiconductor detection in nuclear spectroscopy and having a fast leading edge and slowly decaying trailing edge, said circuit operating with analog-to-digital conversion in accordance with the subranging principle and interpolating residue coding, said circuit comprising:

an internal differentiating analog-to-digital converter receiving the input signals and producing a sampled sequence of the differentiated input signals at a sampling frequency;

a summer having one input connected to an output of said differentiating analog-to-digital converter;

an integrator connected to an output of said summer for digitally integrating a signal outputted from said summer and producing at an output of said integrator a digital reconstruction of sampled input signals;

a digital-to-analog converter connected to said integrator and receiving a signal representing said digital reconstruction of sampled input signals and transforming the received signals into an analog signals corresponding to said digital reconstruction of sampled input signals;

an analog subtractor connected to said digital-to-analog converter and receiving said input signals for subtracting said analog signals from said input signals to form analog residue signals; and an internal analog-to-digital converter for said analog residues connected to said analog subtractor and operating at said sampling frequency for digitalizing said analog residue and producing a digital residue signal, said digital residue signal being supplied to another input of said summer for addition to the digital signal produced by said differentiating analog-to-digital converter in said summer, thereby providing higher resolution and enhanced dynamic range by comparison with those of said internal analog-to-digital converters.

2. The circuit defined in claim 1 wherein said differentiating analog-to-digital converter comprises an analog differentiator having an input receiving said input signals and an output, and a further analog-to-digital converter connected to said output of said differentiator and having an output connected to said summer and forming the output of the differentiating analog-to-digital converter.

3. The circuit defined in claim 2 wherein said further analog-to-digital converter of said differentiating analog-to-digital converter is a flash analog-to-digital converter.

4. The circuit defined in claim 3 wherein said analog-to-digital converter for said residue is a flash analog-to-digital converter with at least one bit resolution.

5. The circuit defined in claim 4 wherein said analog subtractor is a differential amplifier.

6. The circuit defined in claim 5 wherein said integrator is an accumulator.

7. The circuit defined in claim 6 wherein said accumulator has a further summer and a register in cascade and the input of the register is connected with the output of this further summer, a first input of said further summer is an input of the accumulator, a second input of said summer is connected with an output of said register, and the latter output is also an output of said accumulator.

8. The circuit defined in claim 6 wherein the digital-to-analog converter has a higher resolution than the differentiating analog-to-digital converter.

9. The circuit defined in claim 8, further comprising a delay unit connected ahead of a positive input of said subtractor receiving said input signals for compensating delay in a feedback-loop network consisting of said analog-to-digital converter for said residue, said summer, said integrator, said digital-to-analog converter and said subtractor.

10. The circuit defined in claim 9, further comprising a low-pass filter connected ahead of said differential analog-to-digital converter and said subtractor for processing said input signals therethrough to avoid an aliasing effect of high-frequency components of the signals and noise.

11. The circuit defined in claim 1 wherein the further analog-to-digital converter of said differentiating analog-to-digital converter is a flash analog-to-digital converter.

12. The circuit defined in claim 11 wherein said analog-to-digital converter for said residue is a flash analog-to-digital converter with at least one bit resolution.

13. The circuit defined in claim 1 wherein said analog subtractor is a differential amplifier.

14. The circuit defined in claim 1 wherein said integrator is an accumulator.

15. The circuit defined in claim 1 wherein said accumulator has a further summer and a register in cascade and the input of the register is connected with the output of this further summer, a first input of said summer is an input of the accumulator, a second input of said summer is connected with an output of said register, and the latter output is also an output of said accumulator.

16. The circuit defined in claim 1 wherein the digital-to-analog converter has a higher resolution that the differentiating analog-to-digital converter.

17. The circuit defined in claim 1, further comprising a delay unit connected ahead of a positive input of said subtractor receiving said input signals for compensating delay in a feedback-loop network consisting of said analog-to-digital converter for said residue, said summer, said integrator, said digital-to-analog converter and said subtractor.

18. The circuit defined in claim 1, further comprising a low-pass filter connected ahead of said differential analog-to-digital converter and said subtractor for processing said input signals therethrough to avoid an aliasing effect of high-frequency components of the signals and noise.

19. A circuit for sampling of statistically appearing signals, especially such signals as result from semiconductor detection in nuclear spectroscopy and having a fast leading edge and slowly decaying tailing edges, said circuit operating with analog-to-digital conversion in accordance with the subranging principle and interpolating residue coding, said circuit comprising:

a high-pass filter delivering high-pass filtered input signals;

an analog-to-digital converter connected to said high-pass filter and producing a sampled sequence of said high-pass filtered input signals at a sampling frequency;

a summer having one input connected to an output of said analog-to-digital converter;

a digital low-pass filter connected to an output of said summer for digitally processing a signal outputted from said summer and producing at an output of said digital low-pass filter a digital reconstruction of sampled input signals;

a digital-to-analog converter connected to said digital low-pass filter and receiving a signal representing said digital reconstruction of scanned input signals and transforming the received signal into an analog signal corresponding to said digital reconstruction of sampled input signals;

an analog subtractor connected to said digital-to-analog converter and receiving said input signals for subtracting analog signal from said input signals to form an analog residue signal;

a delay unit receiving the input signals and having an output connected to the positive input of said subtractor; and an internal analog-to-digital converter for said analog residue connected to said analog subtractor and operating at said scanning frequency for digitalizing said analog residue and producing a digital residue signal, said digital residue signal being supplied to another input of said summer for addition to the digital signal produced by said differentiating analog-to-digital converter in said summer, thereby providing higher resolution and enhanced dynamic range by comparison with those of said internal analog-to-digital converters.

* * * * *